United States Patent
Mercado

(10) Patent No.: US 7,116,496 B1
(45) Date of Patent: Oct. 3, 2006

(54) HIGH NA LARGE-FIELD UNIT-MAGNIFICATION PROJECTION OPTICAL SYSTEM

(75) Inventor: Romeo I. Mercado, Fremont, CA (US)

(73) Assignee: Ultratech, Inc., San Jose, CA (US)

( * ) Notice: Subject to any disclaimer, the term of this patent is extended or adjusted under 35 U.S.C. 154(b) by 57 days.

(21) Appl. No.: 10/976,971

(22) Filed: Oct. 29, 2004

Related U.S. Application Data

(63) Continuation-in-part of application No. 10/336,066, filed on Jan. 2, 2003, now Pat. No. 6,813,098.

(51) Int. Cl.
*G02B 17/00* (2006.01)
*G03B 27/42* (2006.01)

(52) U.S. Cl. .......................................... 359/727; 355/53
(58) Field of Classification Search ................ 359/355, 359/364, 679, 727; 355/53
See application file for complete search history.

(56) References Cited

U.S. PATENT DOCUMENTS

| | | | |
|---|---|---|---|
| 4,103,989 A | 8/1978 | Rosin | 359/730 |
| 4,171,870 A | 10/1979 | Bruning et al. | 359/487 |
| 4,391,494 A | 7/1983 | Hershel | 359/727 |
| 4,425,037 A | 1/1984 | Hershel et al. | 35/43 |
| 4,964,705 A | 10/1990 | Markle | 359/727 |
| 5,031,977 A | 7/1991 | Gibson | |
| 5,040,882 A | 8/1991 | Markle | 359/727 |
| 5,161,062 A | 11/1992 | Shafer et al. | 359/785 |
| 5,559,629 A | 9/1996 | Sheets et al. | 359/364 |
| 5,805,356 A | 9/1998 | Chiba | 359/727 |
| 6,813,098 B1 * | 11/2004 | Mercado | 359/727 |

* cited by examiner

*Primary Examiner*—David N. Spector
(74) *Attorney, Agent, or Firm*—Allston L. Jones

(57) ABSTRACT

An optical system for projection photolithography is disclosed. The optical system is a modified Dyson system capable of imaging a large field over both a narrow and a broad spectral range. The optical system includes a positive lens group having a positive subgroup of elements that includes at least a plano-convex element and a negative subgroup that includes at least a negative meniscus element. The lens subgroups are separated by a small air space. The positive and negative subgroups constitute a main lens group arranged adjacent to but spaced apart from a concave mirror along the mirror axis. The system also includes a variable aperture stop so that the system has a variable NA. A projection photolithography system that employs the optical system is also disclosed.

35 Claims, 5 Drawing Sheets

HIGH NA LARGE-FIELD UNIT-MAGNIFICATION PROJECTION OPTICAL SYSTEM

CROSS-REFERENCE

This application is a Continuation-In-Part of the patent application having the title Variable Numerical Aperture Large-field Unit-magnification Projection System, Ser. No. 10/336,066 and was filed on Jan. 2, 2003, now U.S. Pat. No. 6,813,098, in the name of the same inventor and assigned to the same assignee.

BACKGROUND OF THE INVENTION

1. Field of the Invention

The present invention relates to optical projection systems, and in particular to a high variable numerical aperture, large-field unit-magnification projection optical system.

2. Description of the Prior Art

Photolithography is presently employed in sub-micron resolution integrated circuit (IC) manufacturing, and also to an increasing degree in advanced wafer-level IC packaging as well as in semiconductor, microelectromechanical systems (MEMS), nanotechnology (i.e., forming nanoscale structures and devices), and other applications. These applications require multiple imaging capabilities from relatively low (i.e., a few microns) resolution with large depth of focus, to sub-micron resolution and a high throughput.

The present invention, as described in the Detailed Description of the Invention section below, is related to, and an improvement on, the optical system described in U.S. Pat. No. 4,391,494 (hereinafter, "the '494 patent") issued on Jul. 5, 1983 to Ronald S. Hershel and assigned to General Signal Corporation, which patent is hereby incorporated as a reference.

FIG. 1 is a cross-sectional diagram of an example prior art optical system 8 according to the '494 patent. The optical system described in the '494 patent and illustrated in FIG. 1 is a unit-magnification, catadioptric, achromatic in the g-h band and is an anastigmatic optical projection system that uses both reflective and refractive elements in a complementary fashion to achieve large field sizes and high numerical apertures (NAs). The system is basically symmetrical relative to an aperture stop located at the mirror, thus eliminating odd order aberrations such as coma, distortion and lateral color. All of the spherical surfaces are nearly concentric, with the centers of curvature located close to where the focal plane would be located were the system not folded. Thus, the resultant system is essentially independent of the index of refraction of the air in the lens, making pressure compensation unnecessary.

Optical system 8 includes a concave spherical mirror 10, an aperture stop AS1 located at the mirror, and a composite, achromatic piano-convex doublet lens-prism assembly 12. Mirror 10 and assembly 12 are disposed symmetrically about an optical axis 14. Optical system 8 is essentially symmetrical relative to an aperture stop AS1 located at mirror 10 so that the system is initially corrected for coma, distortion, and lateral color. All of the spherical surfaces in optical system 8 are nearly concentric.

In optical system 8, doublet-prism assembly 12 includes a meniscus lens 13A, a piano-convex lens 13B and symmetric fold prisms 15A and 15B. In conjunction with mirror 10, assembly 12 corrects the remaining optical aberrations, which include axial color, astigmatism, petzval, and spherical aberration. Symmetric fold prisms 15A and 15B are used to attain sufficient working space for movement of a reticle 16 and a wafer 18.

Optical system 8 also includes an object plane OP1 and an image plane IP1, which are separated via folding prisms 15A and 15B. The cost of the gain in working space is the reduction of available field size to about 25% to 35% of the total potential field. In the past, this reduction in field size has not been critical since it has been possible to obtain both acceptable field size and the degree of resolution required for the state-of-the-art circuits.

However, most present-day (and anticipated future) high-technology micro-fabrication processes (e.g., for wafer-level IC packaging, semiconductor fabrication, forming MEMS and nano-structures, etc.) include performing a large number of exposure steps using 200-mm and 300-mm wafers. Further, the exposures must be performed in a manner that provides a large throughput so that the fabrication process is economically feasible.

Unfortunately, the optical system of the '494 patent is not capable of providing high-quality imaging at large field sizes (e.g., from three to six 34×26 mm step-and scan fields) with minimum resolution ranging from 0.75 micron to 1.4 microns. Such performance is necessary for, among other things, so-called "mix-and-match" applications, wherein different masks requiring different resolutions (which, in turn typically requires different photolithographic systems) are used in the microdevice fabrication process.

It would be advantageous to have a projection optical system capable of providing large-field, lower-resolution imaging, and moderate size field, high-resolution imaging. In order to reduce the large number of exposure steps required by the '494 patent associated with the 200-mm and 300-mm wafers, it is necessary to develop a large-field projection lens capable of imaging multiple step-and-scan fields (34 mm×26 mm) or multiple step-and-repeat fields (22 mm×22 mm). This would provide increased system throughput in these applications. Accordingly, there is an increasing demand for a high NA large-field, variable numerical aperture, high throughput projection photolithography system capable of low and high resolution imaging suitable for bump technology as well as for Mix-and-Match applications. The present invention solves those problems and provides such a projection optical system.

SUMMARY OF THE INVENTION

The present invention is a variable NA, unit-magnification projection optical system. In one embodiment, the system is generally capable of imaging at least six 34 mm×26 mm step-and-scan fields in a low NA configuration (i.e., NA of 0.16 or less), and at least three 34×26 mm step-and-scan fields in a high NA configuration (i.e., NA of 0.34 or greater), or four to five 34 mm×26 mm step-and-scan fields in a mid-range NA configuration (i.e., NA between 0.16 and 0.34).

A first aspect of the invention is an optical system that includes along an optical axis a concave spherical mirror. A variable aperture stop, located at the mirror, determines the NA of the system. A main lens group with positive refracting power is arranged adjacent the mirror and is spaced apart therefrom. The main lens group consists of, in order towards the mirror, a first subgroup having positive refractive power and a second subgroup having negative refractive power. The second subgroup is spaced apart from the first subgroup by an air space. The system also includes first and second prisms each having respective first and second flat surfaces.

The second flat surfaces are arranged adjacent the positive subgroup on opposite sides of the optical axis. The first flat surfaces are arranged adjacent the object and image planes, respectively. The system also has a field size at the image plane that is adjustable by adjusting the variable aperture stop. The adjustable field size capable of imaging two or more 34 mm×26 mm step-and-scan fields.

A second aspect of the invention is a photolithography system that includes the projection optical system of the present invention.

A third aspect of the invention is an optical design of large-field unit-magnification projection optical systems with moderately high numerical apertures, NA≧0.50. These designs provide diffraction-limited imagery for photolithography in the i-line spectrum (365 m±10 nm) covering a field size of 26 mm×34 mm, or at least two 22 mm×22 mm step-and-repeat fields per exposure at an NA of at least 0.50. The optical parameters of this design also can be scaled over a wide range of numerical apertures and field radii, while preserving diffraction-limited performance over the 365 nm±10 nm spectral band-pass encompassing the i-line of the mercury spectrum. The design embodiment can be used to provide a variable numerical aperture lithography system for large exposure fields covering an image of at least six 34 mm×26 mm step-and-scan fields in a low numerical aperture (NA≦0.15) configuration, and at least three 34 mm×26 mm step-and-scan fields in the higher numerical aperture (NA≧0.34) configuration.

Figure 1:
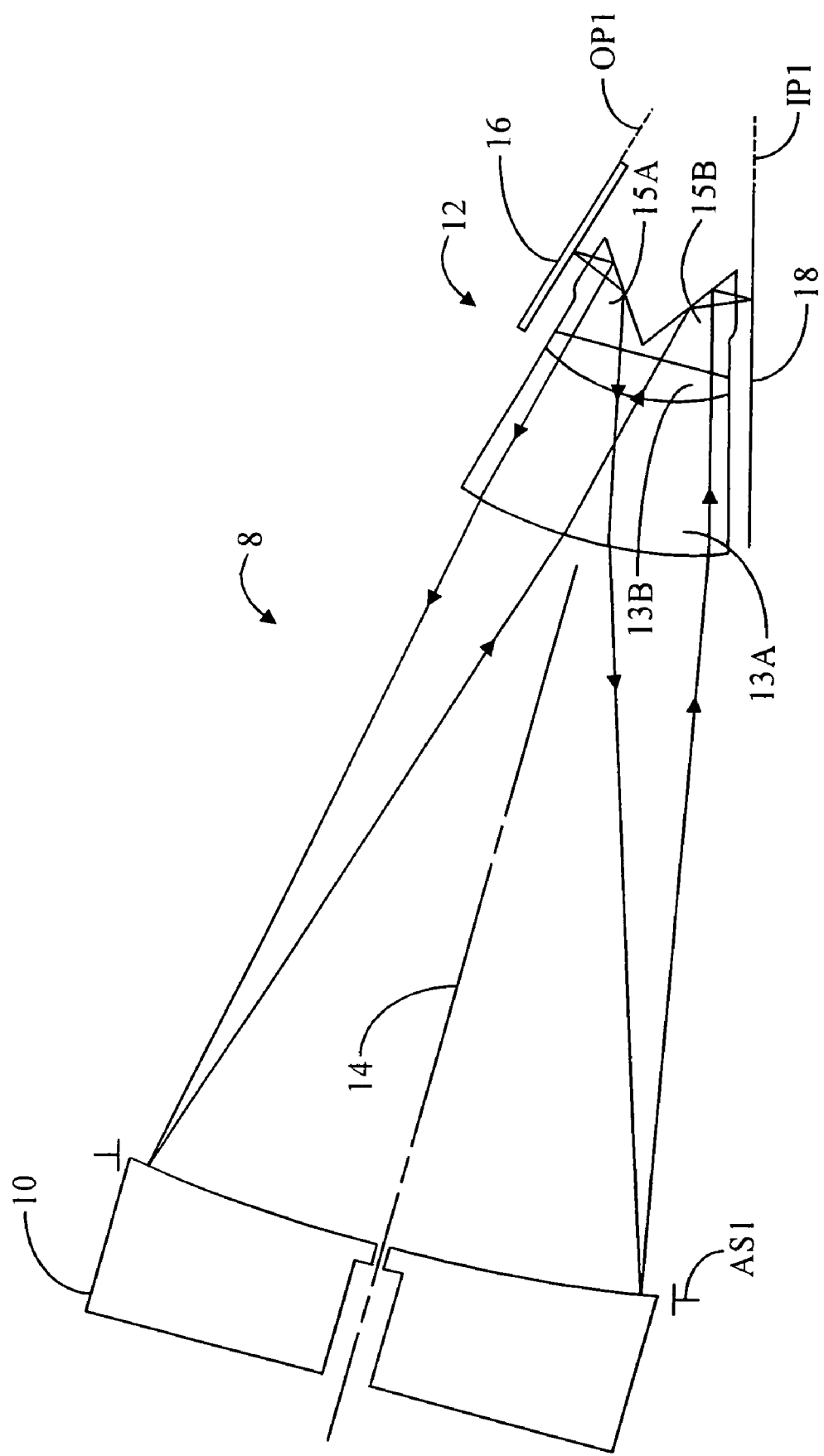
FIG. 1 is a cross-sectional diagram of an example prior art unit-magnification projection optical system according to the '494 patent.

The various elements depicted in the drawings are merely representational and are not necessarily drawn to scale. Certain proportions thereof may be exaggerated, while others may be minimized. The drawings are intended to illustrate various implementations of the invention, which can be understood and appropriately carried out by those of ordinary skill in the art.

DETAILED DESCRIPTION OF THE INVENTION

The present invention is a large-field, broad spectral band or narrow spectral band, color-corrected, anastigmatic, projection optical system that projects an image of a pattern formed on a reticle onto a substrate (wafer) at substantially unit magnification. The unit-magnification projection optical systems of the present invention is an improvement over the prior art optical system of the '494 patent, an embodiment of which is described briefly above and illustrated in FIG. 1.

As used herein, the term "large field" means an exposure field having a rectangular dimensions containing n (where n≧2) step-and-scan fields each having dimensions of 34 mm×26 mm. Thus, as the term is used herein, "exposure field" means a field size the stepper system is capable of imaging when it is used in a step-and-repeat mode of operation. Also, the term "broad spectral band" refers a spectral band that includes the g, h, i, spectral lines of mercury (i.e., 436 nm, 405 nm, 365 nm, respectively). The term "narrow spectral band" refers to a spectral band that includes the i-line (e.g., 365 nm)±10 nm.

The projection optical system of the present invention as described in detail below has very good image quality (i.e., polychromatic Strehl ratios greater than 0.96) over a large field, and over either a broad spectral band or a narrow band spectral band.

The projection optical system of the present invention has two preferred configurations: a broad spectral band, low NA configuration, and a narrow spectral band, high NA configuration. The broad spectral band, low NA configuration is particularly useful for wafer-level IC packaging applications, such as bump lithography and the like, that do not require the highest levels of resolution and that benefit from relatively high-irradiance imaging. On the other hand, the narrow-spectral-band and high NA configuration is useful for applications requiring sub-micron resolution.

The variable NA capabilities at different multiples of 34 mm×26 mm step-and-scan fields provides versatility for performing mix-and-match lithography. For example, the variability of the optical system of the present invention allows for different mask levels having different sized features to be imaged with selective resolution and irradiance levels, rather than carrying out the exposures on a number of different, fixed-parameter systems.

Figure 2:
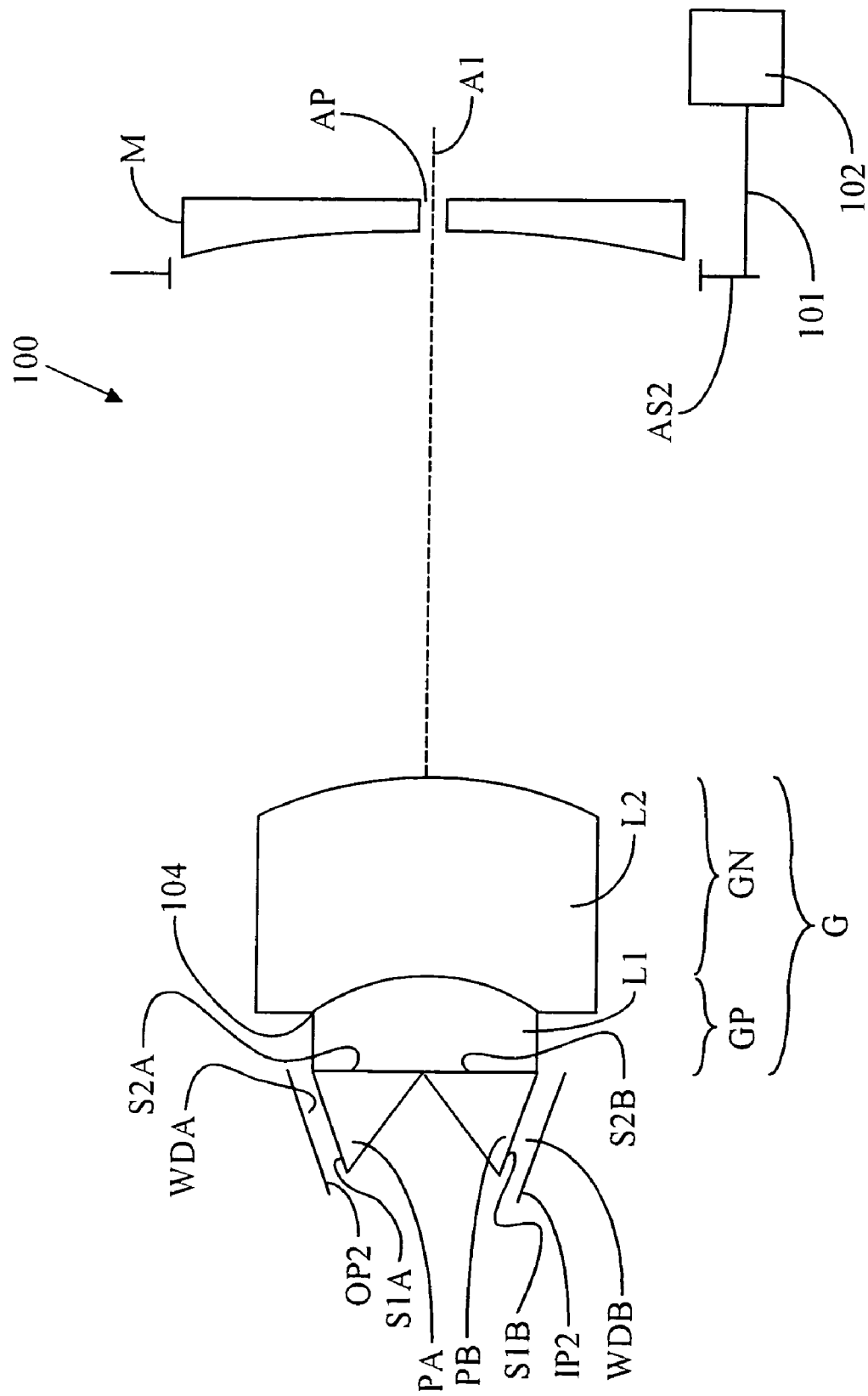
FIG. 2 is cross-sectional diagram of a first example embodiment of the unit-magnification projection optical system of the present invention.
Figure 3:
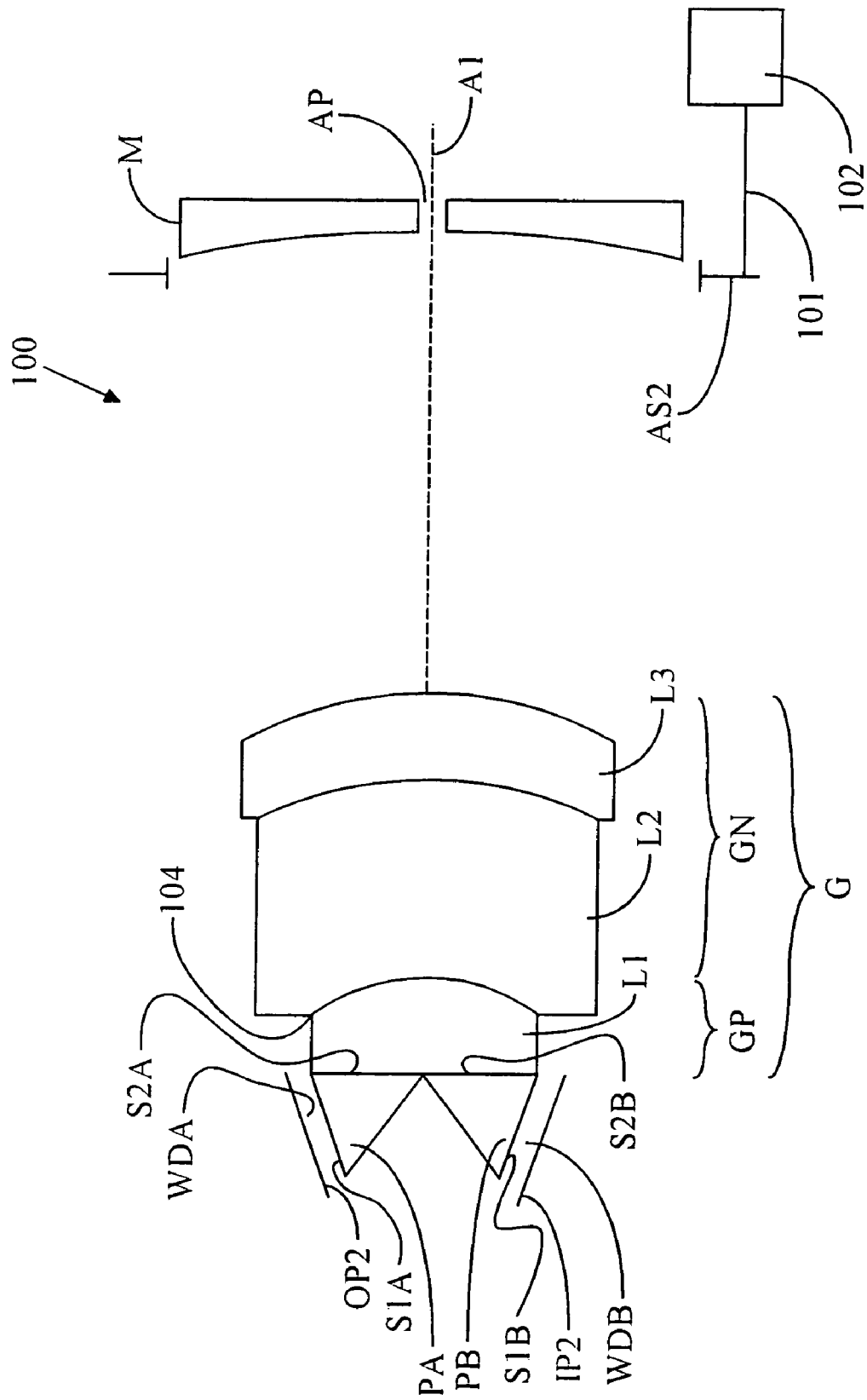
FIG. 3 is cross-sectional diagram of a second example embodiment of the unit-magnification projection optical system of the present invention.
Figure 4:
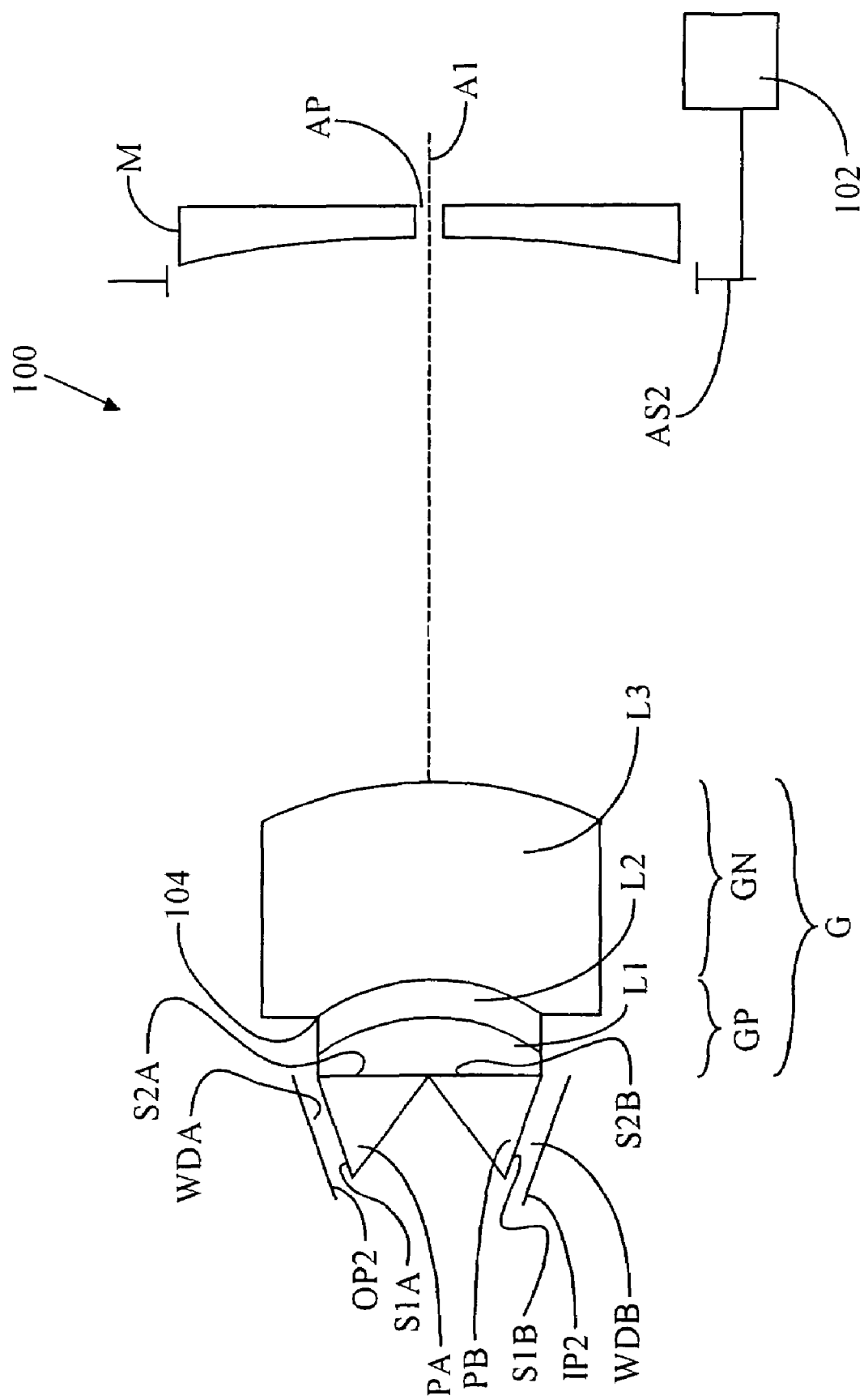
FIG. 4 is cross-sectional diagram of a third example embodiment of the unit-magnification projection optical system of the present invention.

FIGS. 2, 3, and 4 are diagrams of example embodiments of a unit-magnification projection optical system 100 of the present invention. Projection optical system 100 includes, along an axis A1, a concave spherical mirror M. In an example embodiment, mirror M includes an aperture AP on the optical axis. Aperture AP may be used, for example, to introduce light into the optical system for performing functions other than direct imaging with optical system 100, such as for aligning an object (e.g., a mask) with its image, or inspecting the object.

Optical system 100 further includes a variable aperture stop AS2 located at mirror M. Variable aperture stop AS2 may include any one of the known forms of varying the size of an aperture in an optical system, such as an adjustable iris. In an example embodiment, the size of variable aperture stop AS2 is manually set. In another example embodiment, variable aperture stop AS2 is operatively connected via a line 101 (e.g., a wire) to a controller 102 that allows for automatically setting the size of the aperture stop.

Optical system 100 further includes a field corrector (e.g., main) lens group G with positive refractive power arranged along axis A1 adjacent to, and spaced apart from, mirror M. Main lens group G has a positive subgroup GP farthest from mirror M and a negative subgroup GN closer to the mirror and separated from the positive subgroup by a relatively small air space 104. Air space 104 further reduces the residual aberrations, particularly the chromatic variations, while maintaining high-quality imaging performance over wide fields for broad band spectrum and narrow band spectrum variable NA configurations.

With continuing reference to FIGS. 2, 3 and 4, adjacent positive group GP is a first prism PA with surfaces S1A and S2A, and a second prism PB with surfaces S1B and S2B. Surface S1A faces an object plane OP2 and surface S1B faces an image plane IP2. Object plane OP2 and image plane IP2 are spaced apart from respective flat surfaces S1A and S1B by respective gaps WDA and WDB representing working distances. In example embodiments where there is complete symmetry with respect to variable aperture stop AS2, WDA=WDB. Since WDA and WDB are equal to each other, in the accompanying Tables 1–9 those distances are referred to as WD.

Although prisms PA and PB are not included in main lens group G, these prisms play a role in the aberration correction, including chromatic aberration correction.

In an example embodiment, mirror M is aspherized to improve performance of the designs for large field high NA applications. All the example embodiments of the system of the present invention essentially preserve the system symmetry relative to the variable aperture stop AS2, which inherently eliminates the odd-order aberrations such as coma, distortion, and lateral color. Optical system 100 includes no concentric lens elements in main lens group G or lens surfaces that are concentric with the concave mirror M.

The main design differences of optical system 100 over the prior art optical system of the '494 patent include selectively adding air space 104, adding a meniscus lens element, and the optional use of at least one aspherical surface in main lens group G. The main design modifications further include judiciously selecting the optical glass types for the field corrector lenses therein (i.e., lenses L1, L2 in FIG. 2 or L1, L2 and L3 in FIGS. 3 and 4) and prisms PA and PB to correct the field aberrations (particularly astigmatism), spherical aberration, petzval curvature, axial color and chromatic variations of these aberrations at large field sizes, and over a broad or narrow spectral range at different NAs.

Two-Element Main Group

With reference to FIG. 2, in an example embodiment positive subgroup GP includes a single plano-convex lens L1, and negative subgroup GN includes a single negative meniscus lens L2. Further in the example embodiment, lens elements L1, and L2 are two different glass types, that in conjunction with the first and second prisms PA and PB, collectively corrects the chromatic aberrations across a broad spectral band that includes the g, h and i lines. A design based on this example embodiment is set forth in Table 3.

Tables 1 and 2, set forth a design based on this example embodiment wherein chromatic aberrations are corrected over a narrow band that includes the i-line, for a large field and a variable NA ranging from 0.34<NA<0.16.

Three-Element Main Group

In an example embodiment, main lens group G consists of three lens elements L1, L2 and L3. Designs exemplifying this example embodiment are set forth in Tables 4 through 9 and are illustrated in FIGS. 3 and 4.

In conjunction with the first and second prisms, lens elements L1, L2 and L3 correct chromatic aberrations at a narrow spectral band that includes the i-line for a large field and a variable NA system (0.34<NA<0.16), as in the designs set forth in Tables 4 and 5.

In an example embodiment, the lens elements L1, L2 and L3 are each a different glass type. In conjunction with the first and second prisms, chromatic aberrations are corrected over a narrow spectral band. This example embodiment is illustrated in the designs set forth in Tables 8 and 9.

In another example embodiment, the glass types of elements L1 and L3 are identical, as in the designs set forth in Tables 6 and 7.

Single-Element GP, Double-Element GN

With reference to FIG. 3, in an example embodiment, positive subgroup GP includes a single piano-convex lens L1, and negative subgroup GN includes a negative doublet consisting of two negative meniscus lens elements L2 and L3 in optical contact with or cemented to each other.

Single-Element GN, Double-Element GP

With reference to FIG. 4, in an example embodiment, positive subgroup GP consists of a doublet with negative lens elements L1 and L2, and negative subgroup GN consists of a singlet L3. Further in the example embodiment, L1 is a piano-convex lens element in optical contact with or cemented with a negative meniscus lens element L2, and L3 is a single negative meniscus lens element.

Example Designs

Additional example embodiments of optical system 100 are apparent from the designs forth in Tables 1 through 9, and are discussed in greater detail below.

Because of the symmetry of optical system 100, the specifications set forth in Tables 1 through 9 only include values from object plane OP2 to concave mirror M. In the Tables, a positive radius indicates the center of curvature to the right of the surface and negative radius indicates the center of curvature to the left. The thickness of an element, or the separation between elements, is the axial distance to the next surface, and all dimensions are in millimeters. Further, "S#" stands for surface number, e.g. as labeled in FIGS. 2 through 4, "T or S" stands for "thickness or separation", and "STOP" stands for "aperture stop AS2". Also, "CC" stands for "concave" and "CX" stands for "convex."

Further, under the heading "surface shape", an aspheric surface is denoted by "ASP", a flat surface by "FLT" and a spherical surface by "SPH".

The aspheric equation describing an aspherical surface is given by:

$$Z = \frac{(CURV)Y^2}{1 + (1 - (1+K)(CURV)^2 Y^2)^{1/2}} + (A)Y^4 + (B)Y^6 + (C)Y^8 + (D)Y^{10} + (E)Y^{12}$$

wherein "CURV" is the spherical curvature of the surface, K is the conic constant, and A, B, C, D, and E are the aspheric coefficients. In the Tables, "e" denotes exponential notation (powers of 10).

With reference to Tables 1–9, in example embodiment optical system 100 has a three element main lens group G, and first and second prisms PA and PB are formed with glass type 603606, such as Ohara BSM51Y (see Table 8). Further in the example embodiment, plano-convex lens L1 is formed with glass type 458678, such as fused silica or silica glass, and the meniscus lens elements L2 and L3 formed from the glass type 581408, such as Ohara PBL25Y, and glass type 532490, such as Ohara PBL6Y.

In another embodiment of similar design configuration, lens L1 is formed from the glass type 516643, such as Ohara BSL7Y or Schott BK7HT, BK7, UBK7; and lens L2 is formed from glass type 596393, such as Ohara PBM8Y (see Table 9). The glass types for lens L3 and for the prisms in Table 9 are identical to those used in the example embodiment of Table 8.

In another example embodiment, optical system 100 has a three-element main lens group G, and first and second prisms PA and PB are formed with glass type 589612, such as Ohara BAL35Y (see Table 5). Further in the example embodiment, plano-convex lens L1 is formed with glass type 516643, such as Ohara BSL7Y or Schott BK7HT, BK7, UBK7, and the meniscus lens elements L2 and L3 formed from the glass type 596393, such as Ohara PBM8Y, and glass type 458676, such as fuse silica or silica glass.

In another example embodiment, optical system 100 has a three-element main lens group G, and lens L3 includes an aspherical surface on concave surface S7, as illustrated in the design set forth in Tables 8 and 9. In a related example embodiment, lens L3 includes spherical surfaces on concave surface S7 and convex surface S8, as illustrated in Tables 5 and 6.

In another example embodiment, optical system 100 has a three-element main lens group G, and lens L2 has an aspherical surface on surface S5, as illustrated in the design set forth in Tables 4, 5, and 6. And in a similar example embodiment, lens element L1 includes an aspherical surface, as illustrated in the designs set forth in Tables 1, 2, and 3.

In another example embodiment, optical system 100 has either a two-element or three-element main lens group G, and a field size that encompasses at least three 34 mm×26 mm step-and scan fields at an NA of 0.34, at least four 34 mm×26 mm step- and scan fields at an NA of 0.26, and at least six 34 mm×26 mm step-and scan fields at an NA of 0.16 or lower. Example embodiments of such designs are set forth in Tables 1, 4, 5, 6, and 7.

In another example embodiment, optical system 100 has a two-element main lens group G and a field size that encompasses at least five 34 mm×26 mm step-and scan fields at NA of 0.26 and at least six 34 mm×26 mm step-and scan fields at NA of 0.16 or lower (see Table 2).

In another example embodiment, optical system 100 has a two-element main lens group G with a field size that encompasses at least four 34 mm×26 mm step-and scan fields at NA of 0.26 and at least six 34 mm×26 mm step-and scan fields at NA of 0.16 or lower, inclusive, for broad spectral band application with wavelengths that include the g, h, i, spectral lines of mercury light source (see Table 3).

In another example embodiment, optical system 100 has a three-element main lens group G and a field size that encompasses at least two 34 mm×26 mm step-and scan fields at NA of 0.365, at least three 34 mm×26 mm step-and scan fields at NA of 0.34, at least four 34 mm×26 mm step-and scan fields at NA of 0.26 and at least six 34 mm×26 mm step-and scan fields at NA of 0.16 or lower (see Tables 8 and 9).

High NA Large-Field Example Design

FIG. 4, as discussed above, also applies to the high NA large-field design disclosed here. The optical prescriptions of the design example illustrating the features of the present invention are given in Table 10. Since the projection optical system of the present invention is completely symmetric with respect to the aperture stop at the mirror, the optical prescriptions in Table 10 include only values of the optical specifications from the object plane to the concave mirror. In Table 10, light is assumed to travel through the surfaces in order of their numerical sequence. A positive radius indicates the center of curvature is located on the side opposite the initial direction of the light incident on the surface and a negative radius indicates the center of curvature is located on the same side of the light incident on the surface. Thus, a refracting or reflecting surface that is convex with respect to the incident light has a positive radius, while a surface that is concave relative to the incident ray will have a negative radius of curvature. Further clarification of the sign convention can be obtained by comparing the tabulated design with the corresponding design examples shown in FIG. 4. The thickness is the axial distance to the next surface and all dimensions are in millimeters. Further, "S#" stands for surface number, "T or S" stands for "thickness or separation," and "STOP" stands for aperture stop. Also, "CC" stands for "concave" and CX stands for "convex". Further, under the heading "surface shape," an aspheric surface is denoted by "ASP" a flat surface by "FLT" and a spherical surface by "SPH."

With reference to Table 10, in example embodiment optical system 100 of FIG. 4 has a three-element main lens group G, and first and second prisms PA and PB are formed with glass type 603606, such as Ohara BSM51Y. Further in the example embodiment, piano-convex lens L1 is formed with glass type 458678, such as fused silica or silica glass, and the meniscus lens elements L2 and L3 formed from the glass type 581408, such as Ohara PBL26Y, and glass type 532490, such as Ohara PBL1Y.

For a substantially unit magnification projection optical system as in FIG. 4 with the main lens group having a positive refracting power, the first subgroup GP having positive refractive power and the second subgroup GN having negative refractive power and spaced apart from the first subgroup GP by an air space, the first and second prisms, for example, can each be formed from one of the glass types 603606 and 589613.

Also, for the optical projection system of FIG. 4 wherein the first subgroup GP consisting of a doublet lens that consists of, in order towards the mirror, a plano-convex lens with a mirror-facing convex surface and a first negative meniscus lens element with mirror-facing convex surface and the second subgroup GN consisting of a second negative meniscus lens having mirror-facing convex surfaces, with a concave surface of the second meniscus lens separated from the convex surface of the first negative meniscus lens by an air space, examples of the glass types for the first and second prisms both of one of the glass types 603606 and 589612; the plano-convex lens of one of fused silica, silica glass, and glass type 458678; and one of the meniscus elements of glass types consisting of 548458, 532490, 581408, 567428, 629363, and 596387.

A significant advantage provided by the improved high NA large-field projection lens designs of the present invention is the ability to manufacture the lenses using standard optical fabrication and testing technologies currently in use. Additionally, these designs with the well corrected aberrations over the i-line spectrum at numerical apertures ranging from 0.15 to 0.50, enable field radii coverage of 63 mm at the 0.50 NA configuration and 100 mm at the 0.15 NA configuration. The designs also enable a field size containing multiple exposure fields of 34 mm×26 mm and 22 mm×44 mm at 0.50 NA for mix-and-match applications, and thus are suitable for both bump and mix-and-match applications. A large field projection lens design of the present invention is also capable of imaging multiple step-and-scan fields (34 mm×26 mm) or multiple step-and-repeat fields (22 mm×22 mm) in one exposure. The present invention also provides both low and moderately high NA systems with optical parameters scalable over a wide range of apertures and field radii, while preserving diffraction-limited performance over a wide spectrum centered on the i-line (365±10 nm) of mercury.

Photolithography System

Figure 5:
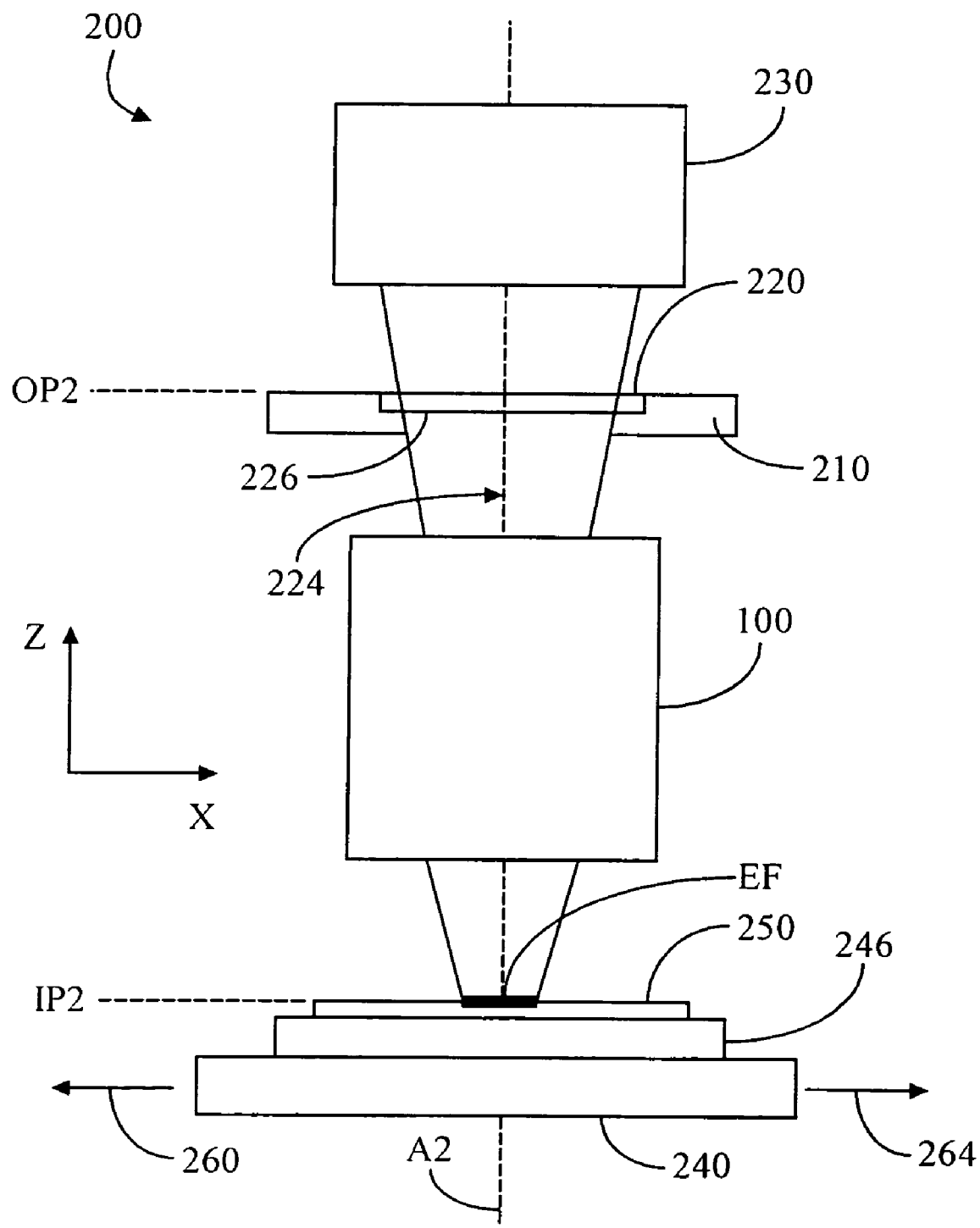
FIG. 5 is a schematic diagram of a photolithography system employing the unit-magnification projection optical system of the present invention.

FIG. 5 is a schematic diagram of a photolithography system 200 employing the unit-magnification projection optical system 100 of the present invention. System 200 has an optical axis A2 and includes along the optical axis a mask stage 210 adapted to support a mask 220 at object plane OP2. Mask 220 has a pattern 224 formed on a mask surface 226. An illuminator 230 is arranged adjacent mask stage 210 opposite optical system 100 and is adapted to illuminate mask 220.

System 200 also includes a wafer stage 240 adapted to movably support a wafer 246 at image plane IP2. In an example embodiment, wafer 246 is coated with a photosensitive layer 250 that is activated by one or more wavelengths of radiation from the illuminator. Such radiation is referred to in the art as "actinic radiation". In an example embodiment, the one or more wavelengths of radiation include the mercury g, h and i lines.

In operation, illuminator 230 illuminates mask 220 while stage 240 is scanned (as indicated by arrow 260) so that pattern 224 is imaged at wafer 246 by optical system 100, thereby forming a pattern in photoresist layer 250. The result is a scanned exposure field EF that occupies a portion of the wafer. Wafer stage 240 then moves ("steps") wafer 246 in a given direction (e.g., the x-direction, as indicated by arrow 264) by a given increment (e.g., the size of one exposure field EF), and the exposure process is repeated. This step-and-expose process is repeated (hence the name "step-and-repeat" until a desired number of scanned exposure fields EF are formed on wafer 246.

The wafer is then removed from system 200 (e.g., using a wafer handling system, not shown) and processed (e.g., developed, baked, etched, etc.) to transfer the pattern formed in the photoresist in each scanned exposure field EF to the wafer. Repeating this photolithography process with different masks allows for three dimensional structures to be formed in the wafer to create operational devices, such as ICs. Further, by varying the NA of system 100, scanned fields EF having different sizes and different resolution levels can be set to correspond to a given mask, thus simplifying the "mix and match" lithography process.

In the foregoing Detailed Description, various features are grouped together in various example embodiments for ease of understanding. The many features and advantages of the present invention are apparent from the detailed specification, and, thus, it is intended by the appended claims to cover all such features and advantages of the described apparatus that follow the true spirit and scope of the invention. Furthermore, since numerous modifications and changes will readily occur to those of skill in the art, it is not desired to limit the invention to the exact construction and operation described herein. Accordingly, other embodiments are within the scope of the appended claims.

TABLE 1

| NA | Field Height (mm) | Design Wavelengths (nm) |
|---|---|---|
| 0.34 < NA < 0.16 | 66 > FH > 81 | 375, 365, 360 |

| | SURFACE DESCRIPTION | | | | ELEMENT |
|---|---|---|---|---|---|
| S # | RADIUS | SHAPE | T or S | MATERIAL | DESCRIPTION |
| 0 | INF | FLT | 0.0000 | | |
| | | | 5.3040 | | Working distance WD |
| 1 | INF | FLT | 80.0000 | BSM51Y Ohara | Prism A/Prism B glass path |
| 2 | INF | FLT | 0.0000 | | |
| 3 | INF | FLT | 68.0000 | Fused Silica | L1 |
| 4 | −150.394 CX | ASP | 1.0000 | | |
| 5 | −150.417 CC | SPH | 184.8479 | PBL1Y Ohara | L2 |
| 6 | −324.610 CX | ASP | 860.8484 | | |
| 7 | −1200.444 CC | ASP | | REFL(STOP) | Mirror M |

| S # | CURV | K | A | B | C | D | E |
|---|---|---|---|---|---|---|---|
| S4 | −0.00664921 | 0 | 4.59626e−10 | −8.87321e−15 | 2.79771e−20 | 7.00047e−23 | −7.87543e−27 |
| S6 | −0.00308062 | 0 | −3.68142e−11 | 1.06325e−15 | −6.02620e−20 | 2.04254e−24 | −2.37962e−29 |
| S7 | −0.00083303 | 0 | −2.91291e−13 | 1.45193e−19 | −6.47718e−24 | 4.88039e−29 | 0 |

TABLE 2

| NA | Field Height (mm) | Design Wavelengths (nm) |
|---|---|---|
| 0.26 < NA < 0.16 | FH > 82 | 375, 365, 360 |

| | SURFACE DESCRIPTION | | | | ELEMENT |
|---|---|---|---|---|---|
| S # | RADIUS | SHAPE | S or T | MATERIAL | DESCRIPTION |
| 0 | INF | FLT | 0.0000 | | |
| | | | 4.1391 | | Working distance WD |
| 1 | INF | FLT | 80.0000 | BSM51Y Ohara | Prism A/Prism B glass path |
| 2 | INF | FLT | 0.0000 | | |
| 3 | INF | FLT | 81.0000 | Fused Silica | L1 |

TABLE 2-continued

| | | | | | | |
|---|---|---|---|---|---|---|
| 4 | −157.590 CX | ASP | 1.0000 | | | |
| 5 | −157.192 CC | SPH | 179.5000 | PBL1Y Ohara | L2 | |
| 6 | −327.055 CX | ASP | 854.3609 | | | |
| 7 | −1201.392 CC | ASP | | REFL (STOP) | Mirror M | |

| S # | CURV | K | A | B | C | D |
|---|---|---|---|---|---|---|
| S4 | −0.00634558 | 0 | 3.60684e−10 | −1.35154e−14 | 5.07503e−19 | −6.06762e−23 |
| S6 | −0.00305759 | 0 | −1.89903e−11 | 7.27523e−16 | −2.41462e−21 | −7.65323e−26 |
| S7 | −0.00083237 | 0 | −5.58053e−13 | −7.98974e−19 | 1.54865e−23 | −1.37639e−28 |

TABLE 3

| NA | Field Height (mm) | Design Wavelengths (nm) |
|---|---|---|
| 0.26 < NA < 0.16 | 71 > FH > 81 | 436, 405, 365, 360 |

| SURFACE DESCRIPTION | | | | ELEMENT |
|---|---|---|---|---|
| S # | RADIUS | SHAPE | S or T | MATERIAL | DESCRIPTION |

| S # | RADIUS | SHAPE | S or T | MATERIAL | DESCRIPTION |
|---|---|---|---|---|---|
| 0 | INF | FLT | 0.0000 | | |
| | | | 6.2180 | | Working distance WD |
| 1 | INF | FLT | 80.0000 | BSM51Y Ohara | Prism A/Prism B glass path |
| 2 | INF | FLT | 0.0000 | | |
| 3 | INF | FLT | 96.0000 | Fused Silica | L1 |
| 4 | −167.380 CX | ASP | 1.0000 | | |
| 5 | −166.578 CC | SPH | 160.0000 | PBL26Y Ohara | L2 |
| 6 | −323.080 CX | ASP | 856.7836 | | |
| 7 | −1202.810 CC | SPH | | REFL (STOP) | Mirror M |

| S # | CURV | K | A | B | C | D |
|---|---|---|---|---|---|---|
| S4 | −0.00597441 | 0 | 6.52825e−10 | −4.79971e−15 | 9.86679e−20 | −4.48678e−24 |
| S6 | −0.00309521 | 0 | −8.98727e−11 | 8.71383e−16 | −1.79763e−20 | 7.53375e−26 |

TABLE 4

| NA | Field Height (mm) | Design Wavelengths (nm) |
|---|---|---|
| 0.34 < NA < 0.16 | 66 > FH > 81 | 375, 365, 360 |

| SURFACE DESCRIPTION | | | | ELEMENT |
|---|---|---|---|---|
| S# | RADIUS | SHAPE | T or S | MATERIAL | DESCRIPTION |

| S# | RADIUS | SHAPE | T or S | MATERIAL | DESCRIPTION |
|---|---|---|---|---|---|
| 0 | INF | FLT | 0.0000 | | |
| | | | 4.0000 | | Working distance WD |
| 1 | INF | FLT | 80.0000 | BSM51Y Ohara | Prism A/Prism B glass path |
| 2 | INF | FLT | 0.0000 | | |
| 3 | INF | FLT | 57.0000 | BSL7Y Ohara | L1 |
| 4 | −167.605 CX | ASP | 1.0000 | | |
| 5 | −166.986 CC | ASP | 166.0000 | PBL25Y Ohara | L2 |
| 6 | −331.766 CX | SPH | 0.0000 | | |
| 7 | −331.766 CC | SPH | 88.0000 | Fused Silica | L3 |
| 8 | −376.002 CX | SPH | 804.0009 | | |
| 9 | −1204.370 CC | ASP | | REFL (STOP) | Mirror M |

TABLE 4-continued

| S # | CURV | K | A | B | C | D | E |
|---|---|---|---|---|---|---|---|
| S4 | −0.00596641 | 0 | 6.07322e−9 | −7.74626e−13 | 1.55889e−17 | −2.04350e−22 | 4.46719e−26 |
| S5 | −0.00598853 | 0 | 4.82006e−9 | −6.70469e−13 | 1.29618e−17 | −1.68338e−22 | 3.68102e−26 |
| S9 | −0.00083031 | 0 | −6.97678e−14 | 1.76001e−19 | 3.69692e−24 | −1.21709e−29 | 0 |

TABLE 5

| NA | Field Height (mm) | Design Wavelengths (mm) |
|---|---|---|
| 0.34 < NA < 0.16 | 66 > FH > 81 | 375, 365, 360 |

| | SURFACE DESCRIPTION | | | | ELEMENT | |
|---|---|---|---|---|---|---|
| S # | RADIUS | SHAPE | T or S | MATERIAL | DESCRIPTION | |
| 0 | INF | FLT | 0.0000 | | | |
| | | | 4.0000 | | Working distance WD | |
| 1 | INF | FLT | 80.0000 | BAL35Y Ohara | Prism A/Prism B glass path | |
| 2 | INF | FLT | 0.0000 | | | |
| 3 | INF | FLT | 60.0000 | BSL7Y Ohara | L1 | |
| 4 | −169.000 CX | ASP | 1.0000 | | | |
| 5 | −168.308 CC | ASP | 159.000 | PBM8Y Ohara | L2 | |
| 6 | −328.667 CX | SPH | 0.0000 | | | |
| 7 | −328.667 CC | SPH | 85.0000 | Fused Silica | L3 | |
| 8 | −369.295 CX | SPH | 811.0010 | | | |
| 9 | −1205.019 CC | ASP | | REFL (STOP) | Mirror M | |

| S # | CURV | K | A | B | C | D | E |
|---|---|---|---|---|---|---|---|
| S4 | −0.00591715 | 0 | 5.46967e−9 | −8.10529e−13 | 1.87242e−17 | −1.05341e−22 | 9.94673e−27 |
| S5 | −0.00594150 | 0 | 4.20887e−9 | −6.82822e−13 | 1.52374e−17 | −8.77226e−23 | 7.18721e−27 |
| S9 | −0.00082986 | 0 | 3.83960e−14 | 3.24431e−19 | 2.56074e−24 | −3.42429e−30 | 0 |

TABLE 6

| NA | Field Height (mm) | Design Wavelengths (nm) |
|---|---|---|
| 0.34 < NA < 0.16 | 66 > FH > 81 | 375, 365, 360 |

| | SURFACE DESCRIPTION | | | | ELEMENT | |
|---|---|---|---|---|---|---|
| S # | RADIUS | SHAPE | T or S | MATERIAL | DESCRIPTION | |
| 0 | INF | FLT | 0.0000 | | | |
| | | | 4.0000 | | Working distance WD | |
| 1 | INF | FLT | 80.0000 | BSM51Y Ohara | Prism A/Prism B glass path | |
| 2 | INF | FLT | 0.0000 | | | |
| 3 | INF | FLT | 57.0000 | BSL7Y Ohara | L1 | |
| 4 | −165.827 CX | ASP | 1.0000 | | | |
| 5 | −165.329 CC | ASP | 159.0000 | PBM8Y Ohara | L2 | |
| 6 | −331.239 CX | SPH | 0.0000 | | | |
| 7 | −331.239 CC | SPH | 85.0000 | BSL7Y Ohara | L3 | |
| 8 | −365.061 CX | SPH | 814.0015 | | | |
| 9 | −1207.011 CC | ASP | | REFL (STOP) | Mirror M | |

| S # | CURV | K | A | B | C | D | E |
|---|---|---|---|---|---|---|---|
| S4 | −0.00603038 | 0 | 5.62079e−9 | −8.54818e−13 | 1.44651e−17 | 2.67969e−22 | −1.11101e−26 |
| S5 | −0.00604853 | 0 | 4.25458e−9 | −7.21928e−13 | 1.13960e−17 | 2.37441e−22 | −1.14963e−26 |
| S9 | −0.00082849 | 0 | −9.10110e−14 | 2.03484e−19 | 3.05353e−24 | −7.57515e−30 | 0 |

TABLE 7

| | NA | Field Height (mm) | | Design Wavelengths (nm) | |
|---|---|---|---|---|---|
| | 0.34 < NA < 0.16 | 66 > FH > 81 | | 375, 365, 360 | |

| | SURFACE DESCRIPTION | | | ELEMENT | |
|---|---|---|---|---|---|
| S # | RADIUS | SHAPE | T or S | MATERIAL | DESCRIPTION |
| 0 | INF | FLT | 0.0000 | | |
| | | | 4.0000 | | Working distance WD |
| 1 | INF | FLT | 80.0000 | BSM51Y Ohara | Prism A/Prism B glass path |
| 2 | INF | FLT | 0.0000 | | |
| 3 | INF | FLT | 71.0000 | Fused Silica | L1 |
| 4 | −153.095 CX | ASP | 1.0000 | | |
| 5 | −153.074 CC | ASP | 116.0000 | PBM8Y Ohara | L2 |
| 6 | −264.195 CX | SPH | 0.0000 | | |
| 7 | −264.195 CC | SPH | 65.0000 | Fused Silica | L3 |
| 8 | −316.630 CX | SPH | 863.0012 | | |
| 9 | −1202.214 CC | ASP | | REFL (STOP) | Mirror M |

| S # | CURV | K | A | B | C | D | E |
|---|---|---|---|---|---|---|---|
| S4 | −0.00653188 | 0 | 5.38198e−9 | −1.44457e−12 | 1.28028e−16 | −7.13994e−21 | 1.10289e−25 |
| S5 | −0.00653279 | 0 | 3.73814e−9 | −1.07614e−12 | 9.47977e−17 | −5.34396e−21 | 8.21139e−26 |
| S9 | −0.00083180 | 0 | −6.48814e−13 | −4.32686e−20 | −7.28682e−24 | 4.90634e−29 | 0 |

TABLE 8

| | NA | Field Height (mm) | | Design Wavelengths (nm) | |
|---|---|---|---|---|---|
| | 0.365 < NA < 0.16 | 57 > FH > 81 | | 375, 365, 360 | |

| | SURFACE DESCRIPTION | | | ELEMENT | |
|---|---|---|---|---|---|
| S # | RADIUS | SHAPE | T or S | MATERIAL | DESCRIPTION |
| 0 | INF | FLT | 0.0000 | | |
| | | | 11.3509 | | Working distance WD |
| 1 | INF | FLT | 80.0000 | BSM51Y Ohara | Prism A/Prism B glass path |
| 2 | INF | FLT | 0.0000 | | |
| 3 | INF | FLT | 51.0000 | Fused Silica | L1 |
| 4 | −175.210 CX | SPH | 0.0000 | | |
| 5 | −175.210 CC | SPH | 23.0000 | PBL25Y Ohara | L2 |
| 6 | −294.442 CX | ASP | 6.8644 | | |
| 7 | −289.633 CC | ASP | 163.0000 | PBL6Y Ohara | L3 |
| 8 | −321.517 CX | SPH | 864.7848 | | |
| 9 | −1203.387 CC | ASP | | REFL (STOP) | Mirror M |

| S # | CURV | K | A | B | C | D | E |
|---|---|---|---|---|---|---|---|
| S6 | −0.00339625 | 0 | 3.29229e−9 | 4.47452e−14 | 2.30196e−18 | −1.82555e−23 | 3.71228e−27 |
| S7 | −0.00345264 | 0 | 2.56224e−9 | 3.75856e−14 | 2.25175e−18 | −2.22294e−23 | 3.60983e−27 |
| S9 | −0.00083099 | 0 | 1.58199e−13 | 9.40171e−19 | 2.63048e−24 | 0 | 0 |

TABLE 9

| | NA | Field Height (mm) | Design Wavelengths (nm) |
|---|---|---|---|
| | 0.365 < NA < 0.16 | 57 > FH > 81 | 375, 365, 360 |

| | SURFACE DESCRIPTION | | | | ELEMENT | |
|---|---|---|---|---|---|---|
| S # | RADIUS | SHAPE | T or S | MATERIAL | DESCRIPTION | |
| 0 | INF | FLT | 0.0000 | | | |
| | | | 11.5085 | | Working distance WD | |
| 1 | INF | FLT | 80.0000 | BSM51Y Ohara | Prism A/Prism B glass path | |
| 2 | INF | FLT | 0.0000 | | | |
| 3 | INF | FLT | 47.0000 | BSL7Y Ohara | L1 | |
| 4 | −174.629 CX | SPH | 0.0000 | | | |
| 5 | −174.629 CC | SPH | 41.3690 | PBM8Y Ohara | L2 | |
| 6 | −335.714 CX | ASP | 4.8062 | | | |
| 7 | −321.463 CC | ASP | 186.1886 | PBL6Y Ohara | L3 | |
| 8 | −353.645 CX | SPH | 829.1278 | | | |
| 9 | −1206.872 CC | ASP | | REFL (STOP) | Mirror M | |

| S # | CURV | K | A | B | C | D | E |
|---|---|---|---|---|---|---|---|
| S6 | −0.00297873 | 0 | 3.47004e−9 | 7.72901e−14 | 1.62750e−18 | 9.06117e−23 | 2.40527e−27 |
| S7 | −0.00311077 | 0 | 2.97392e−9 | 7.94839e−14 | 1.77849e−18 | 9.53056e−23 | 2.75133e−27 |
| S9 | −0.00082859 | 0 | 6.65017e−13 | 1.71571e−18 | 3.99957e−24 | 0 | 0 |

TABLE 10

| | NA | Field Height (mm) | Design Wavelengths (nm) |
|---|---|---|---|
| | 0.50 < NA < 0.15 | 63 > FH > 100 | 375, 365, 360 |

| | SURFACE DESCRIPTION | | | | ELEMENT | |
|---|---|---|---|---|---|---|
| S # | RADIUS | SHAPE | T or S | MATERIAL | DESCRIPTION | |
| 0 | INF | FLT | 0.0000 | | | |
| | | | 5.5000 | | Working distance WD | |
| 1 | INF | FLT | 100.0000 | BSM51Y | Prism A/Prism B glass path | |
| 2 | INF | FLT | 0.0000 | | | |
| 3 | INF | FLT | 53.7328 | Fused Silica | L1 | |
| 4 | −183.807 CX | SPH | 0.0000 | | | |
| 5 | −183.807 CC | SPH | 34.1225 | PBL26Y | L2 | |
| 6 | −387.935 CX | ASP | 10.3300 | | | |
| 7 | −386.276 CC | ASP | 165.1499 | PBL1Y | L3 | |
| 8 | −355.356 CX | SPH | 951.1648 | | | |
| 9 | −1319.027 CC | ASP | | REFL (STOP) | Mirror M | |

| S # | CURV | K | A | B | C | D | E |
|---|---|---|---|---|---|---|---|
| S6 | −0.00257775 | 0 | 2.70077e−9 | 1.82932e−14 | −5.29905e−20 | 2.06710e−23 | −1.83423e−28 |
| S7 | −0.00258882 | 0 | 2.07134e−9 | 1.50020e−14 | −3.86833e−20 | 1.67858e−23 | −1.55791e−28 |
| S9 | −0.00075813 | 0 | −6.07519e−13 | −2.81197e−19 | 2.59956e−25 | | |

What is claimed is:

1. A projection optical system comprising:

a concave mirror with an aperture on its optical axis;

a variable aperture stop located at the concave mirror that determines a numerical aperture (NA) of the system;

a main lens group with positive refracting power arranged adjacent the mirror and spaced apart therefrom, the main lens group comprising in order towards the mirror:

a first subgroup having positive refractive power; and a second subgroup having negative refractive power and spaced apart from first subgroup by an air space; and first and second prisms each having respective first and second flat surfaces, wherein the second flat surfaces are arranged adjacent the positive subgroup on opposite sides of the optical axis, and wherein the first flat surfaces are arranged adjacent object and image planes, respectively;

wherein the optical system is anastigmatic, projects an image of a pattern located in said object plane to said image plane at substantially unit magnification and has an exposure field at the image plane that is variable in size depending on the adjustment of the variable aperture stop.

2. The optical system of claim 1, wherein the adjustable exposure field size includes:
at least one 34 mm×26 mm step-and-scan field at a NA of 0.50;
at least two 34 mm×26 mm step-and-scan fields at a NA of 0.365 or higher;
at least three 34 mm×26 mm step-and-scan fields at a NA of 0.34 or higher;
at least four 34 mm×26 mm step-and-scan fields at a NA of 0.26 or higher; and
at least six 34 mm×26 mm step-and-scan fields at a NA of 0.15 or lower.

3. The optical system of claim 1, wherein the adjustable exposure field size includes:
at least one 34 mm×26 mm step-and-scan field at a NA of 0.50;
at least two 34 mm×26 mm step-and-scan fields at a NA of 0.40;
at least three 34 mm×26 mm step-and-scan fields at a NA of 0.34 or higher;
at least four 34 mm×26 mm step-and-scan fields at a NA of 0.26 or higher; and
at least six 34 mm×26 mm step-and-scan fields at a NA of 0.15 or lower.

4. The optical system of claim 1, wherein the adjustable exposure field size includes:
at least one 34 mm×26 mm step-and-scan field at a NA of 0.50; and
at least two 22 mm×22 mm step-and-repeat fields at a NA of 0.50.

5. The optical system of claim 1, wherein the adjustable exposure field size includes:
at least two 22 mm×22 mm step-and-repeat fields at a NA of 0.50;
at least four 22 mm×22 mm step-and-repeat fields at a NA of 0.40 or higher;
at least six 22 mm×26 mm step-and-repeat fields at a NA of 0.365 or higher;
at least eight 22 mm×22 mm step-and-repeat fields at a NA of 0.26 or higher; and
at least ten 22 mm×22 mm step-and-repeat fields at a NA of 0.15 or lower.

6. The optical system of claim 1, wherein the system is aberration-corrected over a narrow spectral range centered on the I-line, and wherein the adjustable exposure includes:
at least one 34 mm×26 mm step-and-scan field at a NA of 0.50;
at least two 34 mm×26 mm step-and-scan fields at a NA of 0.365 or higher;
at least three 34 mm×26 mm step-and-scan fields at a NA of 0.34 or higher;
at least four 34 mm×26 mm step-and-scan fields at a NA of 0.26 or higher; and
at least six 34 mm×26 mm step-and-scan fields at a NA of 0.15 or lower.

7. The optical system of claim 1, wherein the system is aberration-corrected over a narrow spectral range of the I-line, and wherein the adjustable exposure field size includes:
at least one 34 mm×26 mm step-and-scan field at a NA of 0.50;
at least two 34 mm×26 mm step-and-scan fields at a NA of 0.40 or higher;
at least three 34 mm×26 mm step-and-scan fields at a NA of 0.34 or higher;
at least four 34 mm×26 mm step-and-scan fields at a NA of 0.26 or higher; and
at least six 34 mm×26 mm step-and-scan fields at a NA of 0.15 or lower.

8. The optical system of claim 1, wherein the system is aberration-corrected over a narrow spectral range centered on the I-line, and wherein the adjustable exposure field size includes:
at least one 34 mm×26 mm step-and-scan field at a NA of 0.50; and
at least two 22 mm×22 mm step-and-repeat fields at a NA of 0.50.

9. The projection system of claim 1, having an adjustable NA between 0.50 and 0.15, inclusive.

10. The system of claim 1, further including a controller operatively coupled to the variable stop to adjust the variable aperture stop automatically depending on the data supplied by the image in the object plane.

11. The optical system according to claim 1, in which the concave mirror has an aspherical surface.

12. The projection optical system according to claim 1, wherein the first and second prisms are each formed from one of the glass types 603606 and 589613.

13. The projection system of claim 1, in which at least one lens element has an aspherical surface.

14. A projection optical system comprising:
a concave mirror;
a variable aperture stop located at the mirror and centered on the projection system optical axis that determines a numerical aperture (NA) of the system;
a main lens group with positive refracting power arranged adjacent the mirror and spaced apart therefrom, the main lens group comprising in order towards the mirror:
a first subgroup consisting of a doublet lens that consists of, in order towards the mirror, a plano-convex lens with a mirror-facing convex surface and a first negative meniscus lens element with mirror-facing convex, surface; and
a second subgroup consisting of a second negative meniscus lens having mirror-facing convex surfaces, with a concave surface of the second meniscus lens separated from the convex surface of the first negative meniscus lens by an air space; and
first and second prisms each having respective first and second flat surfaces, wherein the second flat surfaces are arranged adjacent the planar surface of the plano-convex lens on opposite sides of the optical axis, and wherein the first flat surfaces are arranged adjacent object and image planes, respectively;
wherein the optical system is anastigmatic, projects an image of a pattern located in said object plane to said image plane at substantially unit magnification and has an exposure field at the image plane that is adjustable in size by adjusting the variable aperture stop.

15. The system of claim 14, wherein the adjustable exposure field size includes:
at least one 34 mm×26 mm step-and-scan field at a NA of 0.50;
at least two 34 mm×26 mm step-and-scan fields at a NA of 0.365 or higher;
at least three 34 mm×26 mm step-and-scan fields at a NA of 0.34 or higher;

at least four 34 mm×26 mm step-and-scan fields at a NA of 0.26 or higher; and at least six 34 mm×26 mm step-and-scan fields at a NA of 0.15 or lower.

16. The system of claim 14, wherein the adjustable exposure field size includes:
   at least one 34 mm×26 mm step-and-scan field at a NA of 0.50;
   at least two 34 mm×26 mm step-and-scan fields at a NA of 0.40 or higher;
   at least three 34 mm×26 mm step-and-scan fields at a NA of 0.34 or higher;
   at least four 34 mm×26 mm step-and-scan fields at a NA of 0.26 or higher; and
   at least six 34 mm×26 mm step-and-scan fields at a NA of 0.15 or lower.

17. The system of claim 14, wherein the adjustable exposure field size includes:
   at least one 34 mm×26 mm step-and-scan field at a NA of 0.50; and
   at least two 22 mm×22 mm step-and-repeat fields at a NA of 0.50.

18. The system of claim 14, wherein the adjustable exposure field size includes:
   at least two 22 mm×22 mm step-and-scan field at a NA of 0.50;
   at least four 22 mm×22 mm step-and-repeat fields at a NA of 0.40 or higher;
   at least six 22 mm×26 mm step-and-repeat fields at a NA of 0.365 or higher;
   at least eight 22 mm×22 mm step-and-repeat fields at a NA of 0.26 or higher; and
   at least ten 22 mm×22 mm step-and-repeat fields at a NA of 0.15 or lower.

19. The system of claim 14, wherein at least one lens element in the main lens group includes an aspherical surface.

20. The system of claim 14, wherein the mirror has an aspherical surface.

21. The system of claim 14, wherein the first and second prisms are both formed of one of the glass types 603606 and 589612.

22. The system of claim 14, wherein the plano-convex lens is formed from one of fused silica, silica glass, and glass type 458678.

23. The system of claim 14, wherein one of the meniscus elements is formed from a glass type selected from the group of glass types consisting of 548458, 532490, 581408, 567428, 629363, and 596387.

24. A projection lithography system comprising:
   an optical system comprising:
      a concave mirror with an aperture on its optical axis;
      a variable aperture stop located at the concave mirror that determines a numerical aperture (NA) of the system of 0.50 or lower;
      a main lens group with positive refracting power arranged adjacent the mirror and spaced apart therefrom, the main lens group comprising in order towards the mirror:
         a first subgroup having positive refractive power; and
         a second subgroup having negative refractive power and spaced apart from first subgroup by an air space; and
      first and second prisms each having respective first and second flat surfaces, wherein the second flat surfaces are arranged adjacent the positive subgroup on opposite sides of the optical axis, and wherein the first flat surfaces are arranged adjacent object and image planes, respectively;
   wherein the optical system has an exposure field at the image plane that is adjustable in size by adjusting the variable aperture stop;
   a mask stage capable of supporting a mask at the object plane;
   an illuminator adapted to illuminate the mask with at least one of the g-line, h-line, and I-line wavelengths; and
   a wafer stage capable of movably supporting at wafer at the image plane.

25. The system of claim 24, further including a controller operatively coupled to the variable stop to adjust the variable aperture stop automatically depending on the data supplied with the mask.

26. The system of claim 24, having a numerical aperture adjustable between 0.50 and 0.15, inclusive.

27. The system of claim 24, wherein the adjustable exposure field size includes:
   at least one 34 mm×26 mm step-and-scan field at a NA of 0.50;
   at least two 34 mm×26 mm step-and-scan fields at a NA of 0.365 or higher;
   at least three 34 mm×26 mm step-and-scan fields at a NA of 0.34 or higher;
   at least four 34 mm×26 mm step-and-scan fields at a NA of 0.26 or higher; and
   at least six 34 mm×26 mm step-and-scan fields at a NA of 0.15 or lower.

28. The system of claim 24, wherein the adjustable exposure field size includes:
   at least one 34 mm×26 mm step-and-scan field at a NA of 0.50; and
   at least two 22 mm×22 mm step-and-repeat fields at a NA of 0.50.

29. The system of claim 24, wherein the adjustable exposure field size includes:
   at least two 22 mm×22 mm step-and-scan field at a NA of 0.50;
   at least four 22 mm×22 mm step-and-repeat fields at a NA of 0.40 or higher;
   at least six 22 mm×26 mm step-and-repeat fields at a NA of 0.365 or higher;
   at least eight 22 mm×22 mm step-and-repeat fields at a NA of 0.26 or higher; and
   at least ten 22 mm×22 mm step-and-repeat fields at a NA of 0.15 or lower.

30. A projection lithography system comprising:
   an optical system comprising:
      a concave mirror with an aperture on its optical axis;
      a variable aperture stop located at the concave mirror that determines a numerical aperture (NA) of the system of 0.50 or lower;
      a main lens group with positive refracting power arranged adjacent the mirror and spaced apart therefrom, the main lens group comprising in order towards the mirror:
         a first subgroup consisting of a doublet lens that consists of, in order towards the mirror, a plano-convex lens with a mirror-facing convex surface and a first negative meniscus lens element with mirror-facing convex surface; and
         a second subgroup consisting of a second negative meniscus lens having mirror-facing convex surfaces, with a concave surface of the second meniscus lens separated from the convex surface of the first negative meniscus lens by an air space; and first and second prisms each having respective first and second flat surfaces, wherein the second flat surfaces are arranged adjacent the planar surface of the piano-convex lens on opposite sides of the optical axis, and wherein the first flat surfaces are arranged adjacent object and image planes, respectively;

wherein the optical system has an exposure field at the image plane that is adjustable in size by adjusting the variable aperture stop;

a mask stage capable of supporting a mask at the object plane;

an illuminator adapted to illuminate the mask with at least one of the g-line, h-line, and I-line wavelengths; and a wafer stage capable of movably supporting a wafer at the image plane.

31. The system of claim 30, further including a controller operatively coupled to the variable stop to adjust the variable aperture stop automatically depending on the data supplied with the mask.

32. The system of claim 30, having a numerical aperture adjustable between 0.50 and 0.15, inclusive.

33. The system of claim 30, wherein the adjustable exposure field size includes:

at least one 34 mm×26 mm step-and-scan field at a NA of 0.50;

at least two 34 mm×26 mm step-and-scan fields at a NA of 0.365 or higher;

at least three 34 mm×26 mm step-and-scan fields at a NA of 0.34 or higher;

at least four 34 mm×26 mm step-and-scan fields at a NA of 0.26 or higher; and at least six 34 mm×26 mm step-and-scan fields at a NA of 0.15 or lower.

34. The system of claim 30, wherein the adjustable exposure field size includes:

at least one 34 mm×26 mm step-and-scan field at a NA of 0.50; and at least two 22 mm×22 mm step-and-repeat fields at a NA of 0.50.

35. The system of claim 30, wherein the adjustable exposure field size includes:

at least two 22 mm×22 mm step-and-scan field at a NA of 0.50;

at least four 22 mm×22 mm step-and-repeat fields at a NA of 0.40 or higher;

at least six 22 mm×26 mm step-and-repeat fields at a NA of 0.365 or higher;

at least eight 22 mm×22 mm step-and-repeat fields at a NA of 0.26 or higher; and at least ten 22 mm×22 mm step-and-repeat fields at a NA of 0.15 or lower.

* * * * *